United States Patent
Sato (10) Patent No.: US 11,349,321 B2
(45) Date of Patent: May 31, 2022

(54) POWER SOURCE SYSTEM AND ELECTRIC VEHICLE

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventor: Shinichiro Sato, Mie (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 235 days.

(21) Appl. No.: 16/637,367

(22) PCT Filed: Aug. 7, 2018

(86) PCT No.: PCT/JP2018/029530
§ 371 (c)(1),
(2) Date: Feb. 7, 2020

(87) PCT Pub. No.: WO2019/039263
PCT Pub. Date: Feb. 28, 2019

(65) Prior Publication Data
US 2021/0376627 A1 Dec. 2, 2021

(30) Foreign Application Priority Data
Aug. 24, 2017 (JP) .............................. JP2017-160811

(51) Int. Cl.
*B60L 3/04* (2006.01)
*H02J 7/00* (2006.01)
(Continued)

(52) U.S. Cl.
CPC .......... *H02J 7/0032* (2013.01); *B60L 3/0046* (2013.01); *B60L 3/0069* (2013.01); *B60L 3/04* (2013.01);
(Continued)

(58) Field of Classification Search
CPC ........ B60L 3/0046; B60L 3/0069; B60L 3/04; B60L 50/50–52; B60L 50/60;
(Continued)

(56) References Cited

U.S. PATENT DOCUMENTS 5,481,460 A * 1/1996 Masaki ..................... B60L 3/00
701/50
2004/0178008 A1* 9/2004 Kawarasaki ............... B60L 3/04
180/65.1
(Continued)

FOREIGN PATENT DOCUMENTS

JP 2007-318849 A 12/2007
JP 2009-247152 A 10/2009

OTHER PUBLICATIONS

International Search Report, Application No. PCT/JP2018/029530, dated Nov. 13, 2018. ISA/Japan Patent Office.

*Primary Examiner* — Levi Gannon
(74) *Attorney, Agent, or Firm* — Honigman LLP (57) ABSTRACT

The power source system includes high-voltage batteries; a first motor configured to receive power supplied from the high-voltage batteries. A first relay is arranged on a first power supply path. A second motor is configured to receive power supplied from the high-voltage batteries; the second relay that is arranged on a second power supply path. A detection unit detects an abnormality in the first power supply path and the second power supply path. A control unit controls the first relay and the second relay. The detection unit turns off the first relay when an abnormality is detected in the first power supply path, and turns off the second relay
(Continued)

when an abnormality is detected in the second power supply path.

2 Claims, 4 Drawing Sheets

(51) Int. Cl.
  *G01R 31/382* (2019.01)
  *B60L 3/00* (2019.01)
  *B60L 50/51* (2019.01)
  *B60L 50/60* (2019.01)
  *B60L 50/52* (2019.01)

(52) U.S. Cl.
  CPC .............. *B60L 50/51* (2019.02); *B60L 50/52* (2019.02); *B60L 50/60* (2019.02); *G01R 31/382* (2019.01); *B60L 2240/547* (2013.01); *B60L 2240/549* (2013.01)

(58) Field of Classification Search
  CPC .......... B60L 50/61; B60L 58/00; B60L 58/10; B60L 58/16; B60L 58/18; B60L 58/20; B60L 58/21; B60L 2240/527; B60L 2240/529; B60L 2240/547; B60L 2240/549; G01R 31/382; H02J 7/0031; H02J 7/0032
  See application file for complete search history.

(56) References Cited

U.S. PATENT DOCUMENTS

| | | |
|---|---|---|
| 2008/0183361 A1* | 7/2008 | Oyama ................. B60L 3/0092 701/99 |
| 2013/0325239 A1* | 12/2013 | Ozaki ...................... B60T 7/12 701/22 |
| 2014/0067178 A1 | 3/2014 | Taira et al. |
| 2014/0195097 A1* | 7/2014 | Yamanaka .............. B60L 50/16 701/29.1 |
| 2016/0082850 A1 | 3/2016 | Yamasaki et al. |
| 2018/0079310 A1* | 3/2018 | Kawashima .......... B60W 20/00 |
| 2019/0092257 A1* | 3/2019 | Boecker ................. H02J 9/061 |

* cited by examiner

| Drive system during normal operation | 4WD | | Front wheel drive (rear wheel assist) | | Rear wheel drive (front wheel assist) | |
|---|---|---|---|---|---|---|
| System not operable at time of abnormality | Front wheels | Rear wheels | Front wheels | Rear wheels | Front wheels | Rear wheels |
| System operable after abnormality | Rear wheels | Front wheels | Rear wheels | Front wheels (no change) | Rear wheels | Front wheels (no change) |

POWER SOURCE SYSTEM AND ELECTRIC VEHICLE

CROSS-REFERENCE TO RELATED APPLICATIONS

This application is the U.S. national stage of PCT/JP2018/029530 filed on Aug. 7, 2018, which claims priority of Japanese Patent Application No. JP 2017-160811 filed on Aug. 24, 2017, the contents of which are incorporated herein.

TECHNICAL FIELD

The present specification discloses a technique related to a power source system.

BACKGROUND

Electric vehicles are conventionally known in which power is stored in a battery element and is output to a motor via a relay, and the vehicle thus travels by the driving force of the motor. JP 2007-318849A includes a high-voltage battery, an inverter that converts DC voltage of the high-voltage battery into AC voltage, a drive motor to which the AC voltage output from the inverter is supplied, and a system main relay that is interposed between the high-voltage battery and the inverter.

Here, in a configuration in which a power supply path is provided from the high-voltage battery to the drive motor, it is conceivable that an abnormality such as a disconnection, a ground fault, or the like may occur in the power supply path for some sort of reason. A problem with the configuration in JP 2007-318849A is that power can not be supplied from the high-voltage battery to the drive motor if an abnormality such as a disconnection or a ground fault occurs between the high-voltage battery and the drive motor, thus making it no longer possible for the electric vehicle to continue to travel.

The technique disclosed in the present specification was achieved based on the circumstances described above, and an object thereof is to provide a power source system and electric vehicle in which the vehicle can continue to travel even if an abnormality such as a disconnection or a ground fault occurs in the power supply path from a battery element to a motor.

SUMMARY

The technique described in the present specification is of a power source system for installation in a vehicle, the power source system including: a battery element; a first motor that is configured to receive power supplied from the battery element and drive a front wheel of the vehicle; a first relay that is arranged on a first power supply path between the battery element and the first motor and is configured to turn the passage of electric current on the first power supply path on and off a second motor that is configured to receive power supplied from the battery element and drive a rear wheel of the vehicle; a second relay that is arranged on a second power supply path between the battery element and the first motor and is configured to turn the passage of electric current on the second power supply path on and off a detection unit that is configured to detect an abnormality in the first power supply path and the second power supply path; and a control unit that is configured to control the turning on and off of the first relay and the second relay; wherein, when the detection unit does not detect an abnormality in the first power supply path and the second power supply path, the control unit turns on the first relay and the second relay to allow electric current to pass through the first power supply path and the second power supply path, when the detection unit detects an abnormality in the first power supply path, the control unit turns off the first relay to not allow electric current to pass through the first power supply path, and when the detection unit detects an abnormality in the second power supply path, the control unit turns off the second relay to not allow electric current to pass through the second power supply path.

With this configuration, if an abnormality such as a disconnection, ground fault, or the like occurs in one of the first power supply path and the second power supply path that supply power from the battery to the first motor and the second motor, then electric current is not allowed to pass through the power supply path in which the abnormality has been detected and it is possible to continue to drive either the front wheels or the rear wheels by the conduction of the power supply path in which no abnormality was detected, and thus the vehicle can continue to travel. Accordingly, the vehicle can continue to travel even if an abnormality such as a disconnection or a ground fault occurs in the power supply path from the battery element to the motor.

The following are preferable embodiments of the technique disclosed in the present specification.

A plurality of the battery elements including a first battery element and a second battery element are included, wherein the first motor receives power from the first battery element through the first power supply path, and the second motor receives power from the second battery element through the second power supply path.

With this configuration, when an abnormality occurs in one of the power supply paths due to a problem in one of the first battery element and the second battery element, the power supplied from one of the power supply paths to one of the motors is cut off, and power is supplied from the other power supply path to the other motor, which makes it possible to continue to drive the other motor. Thus, the vehicle can continue to travel even if a problem occurs in one of the first battery element and the second battery element, and therefore the vehicle can continue to reliably travel compared to a case where the vehicle only includes one battery element.

A connection conduction path that connects the first power supply path and the second power supply path to each other; and a separation relay that is arranged on the connection conduction path and is configured to turn the passage of electric current on the connection conduction path on and off are included, wherein, when the detection unit detects that an abnormality has not occurred in the first power supply path and the second power supply path, the control unit turns on the separation relay to allow electric current to pass through the connection conduction path, and when the detection unit detects that an abnormality has occurred in at least one of the first power supply path and the second power supply path, the control unit turns off the separation relay and does not allow electric current to pass through the connection conduction path.

With this configuration, when an abnormality does not occur in the first power supply path and the second power supply path, the separation relay is turned on and electric current is allowed to pass through the connection conduction path, and therefore it is possible to drive the first motor and the second motor with use of power from both the first battery element and the second battery element. Also, when an abnormality occurs in at least one of the first power supply path and the second power supply path, the separation relay is turned off and electric current is not allowed to pass through the connection conduction path, and therefore the abnormality of the one power supply path does not affect the other operating power supply path, which makes it possible to continue to drive the vehicle because power is supplied to the motor through the operating power supply path.

The power source system, wherein the electric vehicle is capable of traveling by the front wheels and the rear wheels being driven by the first motor and the second motor.

Advantageous Effects of Disclosure

With the technique described in the present specification, the vehicle can continue to travel even if an abnormality such as a disconnection or a ground fault occurs in a power supply path from a battery to a motor.

DETAILED DESCRIPTION OF PREFERRED EMBODIMENTS

A power source system 20 of the present embodiment is installed in a vehicle 10, which may be an electric vehicle for example, and drives front wheels 11A and rear wheels 11B of the vehicle 10 with use of power from two (a plurality of) high-voltage batteries 21A and 21B.

Figure 1:
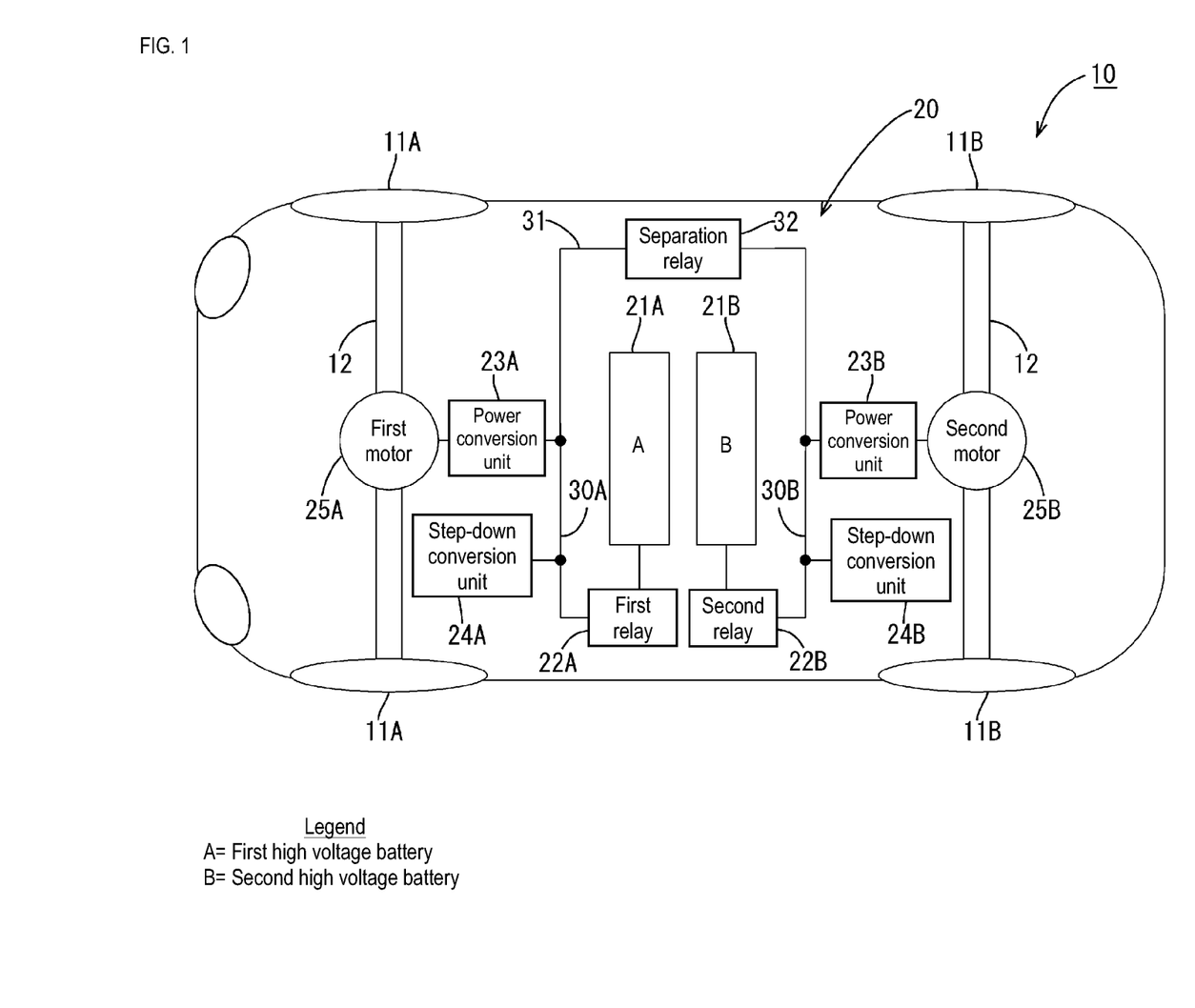
FIG. 1 is a diagram showing a configuration of a power source system installed in a vehicle.

As shown in FIG. 1, the power source system 20 includes the first high-voltage battery 21A (an example of a first battery element), the second high-voltage battery 21B (an example of a second battery element), a first motor 25A that drives the front wheels 11A of the vehicle 10, and a second motor 25B that drives the rear wheels 11B of the vehicle 10. The first high-voltage battery 21A and the second high-voltage battery 21B are lithium-ion rechargeable batteries in the present embodiment, and can store power that enables the vehicle 10 to travel. The first motor 25A and the second motor 25B are motor generators that can both generate (regenerate) power during deceleration and the like. The first motor 25A is fixed to a drive shaft 12 that joins the pair of front wheels 11A and rotates the front wheels 11A, and the second motor 25B is fixed to another drive shaft 12 that joins the pair of rear wheels 11B and rotates the rear wheels 11B. The first motor 25A and the second motor 25B may be DC motors, AC motors, and the like. Note that the motors 25A and 25B are not limited to being fixed to the drive shafts 12, and may also be in-wheel motors that are integrally attached to the wheels.

The conduction path that connects the high-voltage batteries 21A and 21B and the motors 25A and 25B (the conduction path from the high-voltage batteries 21A and 21B to the motors 25A and 25B) includes a first power supply path 30A that electrically connects the first high-voltage battery 21A and the first motor 25A, a second power supply path 30B that electrically connects the second high-voltage battery 21B and the second motor 25B, and a connection conduction path 31 that electrically connects the first power supply path 30A and the second power supply path 30B. A first relay 22A is connected in series on the first power supply path 30A, and the first relay 22A is turned on and off to switch between allowing electric current to pass and not allowing electric current to pass through the first power supply path 30. A second relay 22B is connected in series on the second power supply path 30B, and the second relay 22B is turned on and off to switch between allowing electric current to pass and not allowing electric current to pass through the second power supply path 30B. A separation relay 32 is connected in series on the connection conduction path 31, and the separation relay 32 is turned on and off to switch between allowing electric current to pass and not allowing electric current to pass through the connection conduction path 31.

The first relay 22A and the second relay 22B are system main relays that may include a coil and a connection point for example, and electromagnetic switches capable of conducting electric current necessary for the vehicle 10 to travel can be used as the first relay 22A and the second relay 22B. Note that there is no limitation to this, and various types of switches can be used for the relays 22A and 22B, including semiconductor switches such as FETs (Field effect transistors).

Figure 2:
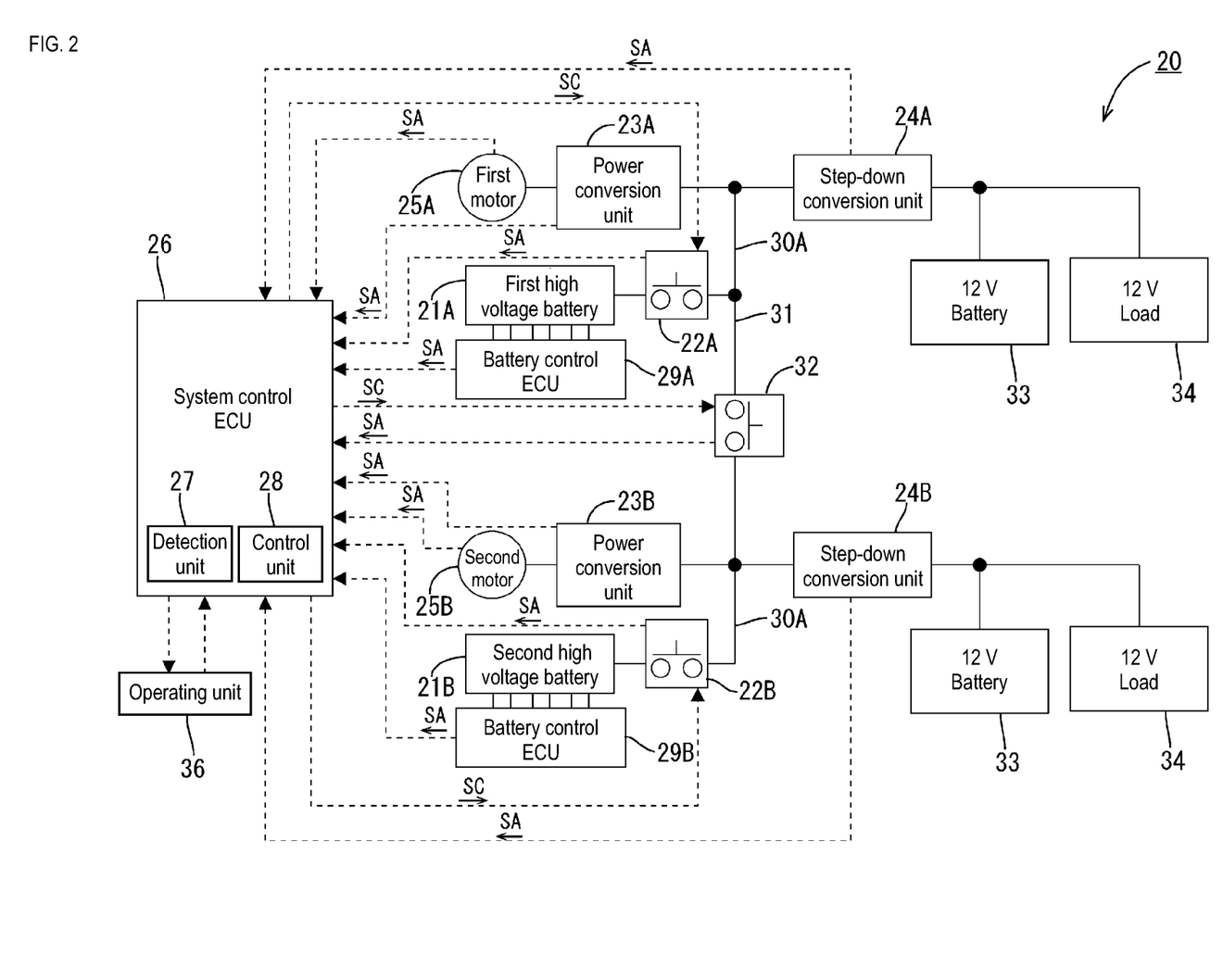
FIG. 2 is a diagram showing an electrical configuration of the power source system.

The first high-voltage battery 21A, the first relay 22A, a power conversion unit 23A, and the first motor 25A are connected in series on the first power supply path 30A, and the second high-voltage battery 21B, the second relay 22B, a power conversion unit 23B, and the second motor 25B are connected in series on the second power supply path 30B. A DC-DC converter is used if the power conversion units 23A and 23B supply DC power to the motors 25A and 25B, and an inverter is used if the power conversion units 23A and 23B supply AC power to the motors 25A and 25B. When the motors 25A and 25B generate power as generators, the power conversion units 23A and 23B output DC power towards the high-voltage batteries 21A and 21B. Step-down conversion units 24A and 24B are connected to conduction paths that branch from the power supply paths 30A and 30B. The step-down conversion units 24A and 24B may be step-down DC-DC converters, and are connected in parallel to the motors 25A and 25B. As shown in FIG. 2, the step-down conversion units 24A and 24B are connected to a 12 [V] battery 33 and a 12 [V] load 34. The battery 33 may be a lead battery, and the load 34 may be an electrical component, such as a lamp, that operates with use of power from a 12 [V] power source.

As shown in FIG. 2, the power source system 20 includes two (a plurality of) battery control ECUs (Electronic Control Units) 29A and 29B, and one system control ECU (Electronic Control Unit) 26. The battery control ECU 29A is connected to the first high-voltage battery 21A, and the battery control ECU 29B is connected to the second high-voltage battery 21B. The battery control ECUs 29A and 29B detect the voltage and current of the high-voltage batteries 21A and 21B, and output a detection signal SA to the system control ECU 26, the detection signal SA being in accordance with the voltage values, current values, and the like detected from the high-voltage batteries 21A and 21B.

The system control ECU 26 includes a detection unit 27 that detects abnormalities (faults) such as disconnections or ground faults in the power supply paths 30A and 30B based on the voltages and currents of the power supply paths 30A and 30B, and a control unit 28 that controls the relays 22A, 22B, and 32. The detection unit 27 receives an input of the detection signal SA according to the voltage value and current value at points along the power supply paths 30A and 30B that correspond to the each of the motors 25A and 25B, the relays 22A and 22B, the power conversion units 23A and 23B, the step-down conversion units 24A and 24B, and the like, and the detection signal SA according to the voltage values and the current values of the high-voltage batteries 21A and 21B output from the battery control ECUs 29A and 29B. The detection unit 27 detects whether or not an abnormality (fault) has occurred in the power supply paths 30A and 30B based on the voltage values and the current values at the points along the power supply paths 30A and 30B, which are obtained from the detection signal SA. An example of detecting a specific abnormality (fault) would be detecting (determining) an abnormality in the power supply paths 30A and 30B by comparing the voltage values and the current values thereof to a predetermined threshold value. Note that there is no limitation to this, and a configuration is also possible in which an abnormality (fault) is detected (determined) if the fluctuating range of the voltage or the fluctuating range of the current within a predetermined period of time exceeds a predetermined threshold value. Note that an abnormality may be determined by both the voltage value and the current value, but there is no limitation thereto, and a configuration is also possible in which an abnormality is detected (determined) by comparing at least one of the voltage value and the current value (or at least one of the fluctuating range of the voltage or the fluctuating range of the current) with a predetermined threshold value.

Note that examples of abnormalities (voltage abnormalities, current abnormalities) in the power supply paths 30A and 30B include: a defect, a failure, or deterioration (reduced capacity or output capability) of the high-voltage batteries 21A and 21B; an on fault or an off fault of the first relay 22A and the second relay 22B; an open fault, short circuit fault, or the like of the converter, inverter, or the like; and a short circuit fault, open fault or the like of the motors 25A and 25B.

Figure 3:
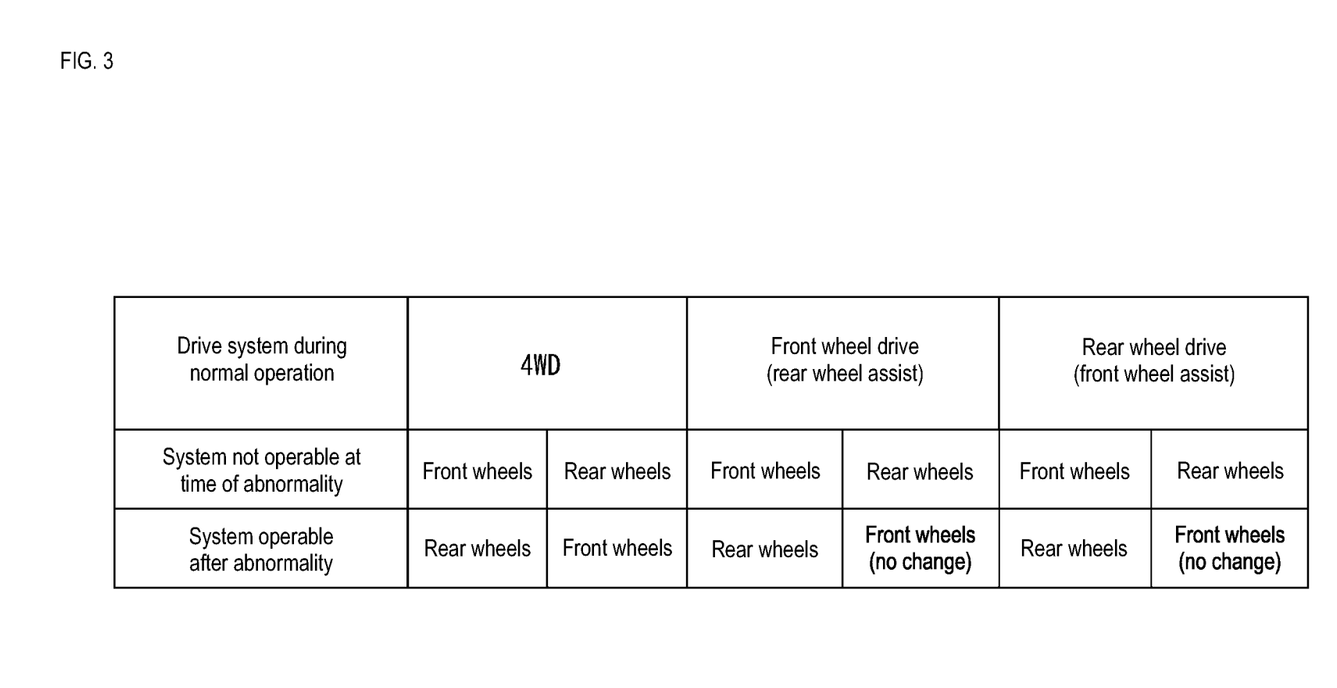
FIG. 3 is a diagram showing the drive system of the vehicle when operating normally and when an abnormality has occurred.

The control unit 28 outputs a control signal SC, which is for controlling the operation of the relays 22A, 22B, and 32, according to the abnormality detection result of the detection unit 27. Specifically, if an abnormality occurs in at least one of the power supply paths 30A and 30B, the control unit 28 turns off the separation relay 32, turns off the relay 22A (22B) on the power supply path in which the abnormality has occurred in order to stop the supply of power to the motor 25A (25B) from the power supply path in which the abnormality has occurred, and uses the power supply path 30B (30A) in which the abnormality has not occurred to supply power to and drive the motor 25B (25A) on the power supply path in which the abnormality has not occurred, therefore changing the drive mode (see FIG. 3). Thus, only the rear wheels will be driven if an abnormality occurs in the first power supply path 30A, and only the front wheels will be driven if an abnormality occurs in the second power supply path 30B.

As shown in FIG. 2, the system control ECU 26 is connected to an operating unit 36. The operating unit 36 can, for example, be provided in the passenger compartment of the vehicle 10 and be operated by a user, and enables selection of the drive mode from any of four-wheel drive (4WD), front-wheel drive, and rear-wheel drive. Four-wheel drive means to travel with the front and rear wheels driven by both the first motor 25A and the second motor 25B. Front-wheel drive means to drive the front wheels 11A with the driving force of the first motor 25A, and the second motor 25B reduces the output thereof and the rear wheels 11B are thus driven auxiliary. Rear-wheel drive means to drive the rear wheels 11B with the driving force of the second motor 25B, and the first motor 25A reduces the output thereof and the front wheels 11A are thus driven auxiliary. The operating unit 36 outputs information about the selected drive mode to the system control ECU 26. During normal operation (that is, when no abnormalities have occurred in the power supply paths 30A and 30B), the system control ECU 26 drives the vehicle 10 in the drive mode selected through the operating unit 36, and if an abnormality occurs in the power supply paths 30A and 30B, the system control ECU 26 will change the drive mode and will output information about the current drive mode to the operating unit 36 for example, and thus the operating unit 36 will notify the user of the current drive mode by displaying the information on a display unit.

Next, the processing of the system control ECU 26 will be described with reference to FIG. 4.

Figure 4:
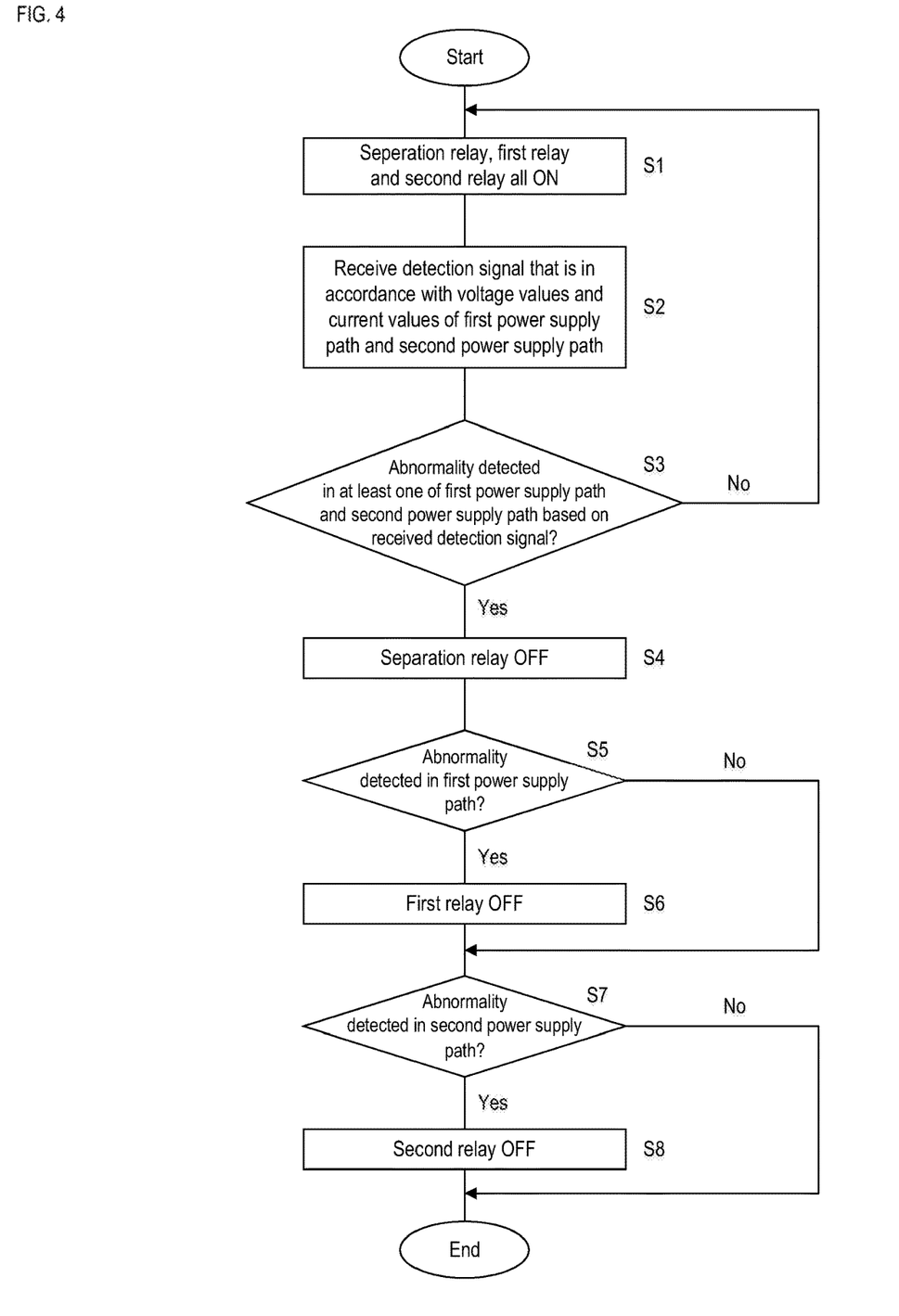
FIG. 4 is a flowchart showing the processing of a system control ECU.

As shown in FIG. 4, during normal operation, the system control ECU 26 outputs the control signal SC to the separation relay 32, the first relay 22A, and the second relay 22B, and turns on the separation relay 32, the first relay 22A, and the second relay 22B (step S1). The first power supply path 30A, the second power supply path 30B, and the connection conduction path 31 are thus all in a conductive state, and therefore the vehicle 10 can travel in any one of four-wheel drive, front-wheel drive (rear wheel assisted), and rear-wheel drive (front wheel assisted), depending on the setting of the operating unit 36 (see FIG. 3).

Also, the system control ECU 26 receives the detection signal SA at predetermined intervals (step S2), the detection signal SA being in accordance with the voltage values and current values at a plurality of locations on the first power supply path 30A and the second power supply path 30B. The detection unit 27 of the system control ECU 26 then compares the voltage values and current values of the received detection signal SA with predetermined threshold values stored in a memory in advance, and detects (determines) if an abnormality has occurred based on whether or not the voltage values and current values are greater than or equal to a predetermined threshold value (or equal to or less than the predetermined threshold values) (step S3).

In step S3, if an abnormality has not been detected in the power supply paths 30A and 30B (NO in step S3), then the relays 22A, 22B, and 32 are all on (step S1), and receiving the detection signal SA (step S2) and detecting abnormalities (step S3) thus continues. On the other hand, in step S3, if an abnormality is detected in at least one of the power supply paths 30A and 30B (YES in step S3), the system control ECU 26 turns off the separation relay 32 (step S4) such that electric current is not allowed to pass through the connection conduction path 31. In this way, the power sources between the first high-voltage battery 21A and the second high-voltage battery 21B are separated from each other, and an abnormality occurring in one of the power supply paths 30A and 30B will not effect the other power supply path 30A or 30B.

Next, it is determined whether or not an abnormality has been detected in the first power supply path 30A (step S5), and if an abnormality has been detected in the first power supply path 30A (YES in step S5), then the first relay 22A is turned off (step S6), and if an abnormality has not been detected in the first power supply path 30A (NO in step S5), then the first relay 22A is kept on (is not turned off). Also, it is determined whether or not an abnormality has been detected in the second power supply path 30B (step S7), and if an abnormality has been detected in the second power supply path 30B (YES in step S7), then the second relay 22B is turned off (step S8), and if an abnormality has not been detected in the second power supply path 30B (NO in step S7), then the second relay 22B is kept on (is not turned off). Thus, the vehicle 10 can continue to travel by the drive of the front wheels 11A or the rear wheels 11B with use of the power supplied from the power supply path 30A or 30B in which no abnormality has been detected.

The present embodiment produces the following actions and effects.

The power source system 20 for installation in the vehicle 10, the power source system 20 including: the high-voltage batteries 21A and 21B (battery elements); the first motor 25A that is configured to receive power supplied from the high-voltage batteries 21A and 21B and drive the front wheels 11A of the vehicle 10; the first relay 22A that is arranged on the first power supply path 30A between the high-voltage batteries 21A and 21B and the first motor 25A and is configured to turn the passage of electric current on the first power supply 30A path on and off the second motor 25B that is configured to receive power supplied from the high-voltage batteries 21A and 21B and drive the rear wheels 11B of the vehicle 10; the second relay 22B that is arranged on a second power supply path 30B between the high-voltage batteries 21A and 21B and the first motor 25A and is configured to turn the passage of electric current on the second power supply path 30B on and off the detection unit 27 that is configured to detect an abnormality in the first power supply path 30A and the second power supply path 30B; and the control unit 28 that is configured to control the turning on and off of the first relay 22A and the second relay 22B; wherein, when the detection unit 27 does not detect an abnormality in the first power supply path 30A and the second power supply path 30B, the control unit 28 turns on the first relay 22A and the second relay 22B to allow electric current to pass through the first power supply path 30A and the second power supply path 30B, when the detection unit 27 detects an abnormality in the first power supply path 30A, the control unit 28 turns off the first relay 22A to not allow electric current to pass through the first power supply path 30A, and when the detection unit 27 detects an abnormality in the second power supply path 30B, the control unit turns off the second relay 22B to not allow electric current to pass through the second power supply path 30B.

With this embodiment, if an abnormality such as disconnection, a ground fault, or the like occurs in one of the first power supply path 30A and the second power supply path 30B that supply power from the high-voltage batteries 21A and 21B to the first motor 25A and the second motor 25B, then electric current is not allowed to pass through the power supply path 30A or 30B in which the abnormality has been detected and it is possible to continue to drive either the front wheels 11A or the rear wheels 11B by the electric current that passes through the power supply path 30A or 30B in which no abnormality has been detected, and thus the vehicle 10 can continue to travel. Accordingly, the vehicle 10 can continue to travel even if an abnormality such as a disconnection, a ground fault, or the like occurs in one of the power supply paths 30A and 30B from the high-voltage batteries 21A and 21B to the motors 25A and 25B.

Also, the plurality of high-voltage batteries 21A and 21B include the first high-voltage battery 21A (first battery element) and the second high-voltage battery 21B (second battery element), wherein the first motor 25A receives power from the first high-voltage battery 21A through the first power supply path 30A, and the second motor 25B receives power from the second high-voltage battery 21B through the second power supply path 30B.

With this configuration, when an abnormality occurs in one of the power supply paths 30A and 30B due to a problem in one of the first high-voltage battery 21A and the second high-voltage battery 21B, the power supplied from one power supply path 30A (30B) to one motor 25A (25B) is cut off, and power is supplied from the other power supply path 30B (30A) to the other motor 25B (25A), which makes it possible to continue to drive the other motor 25B (25A). Thus, the vehicle 10 can continue to travel even if a problem occurs in one of the first high-voltage battery 21A and the second high-voltage battery 21B, and therefore the vehicle 10 can continue to reliably travel compared to a case where the vehicle 10 only includes one high-voltage battery.

Also, the connection conduction path 31 connects the first power supply path 30A and the second power supply path 30B to each other; and the separation relay 32 is arranged on the connection conduction path 31 and is configured to turn the passage of electric current on the connection conduction path 31 on and off, wherein, when the detection unit 27 detects that an abnormality has not occurred in the first power supply path 30A and the second power supply path 30B, the control unit 28 turns on the separation relay 32 to allow electric current to pass through the connection conduction path 31, and when the detection unit 27 detects that an abnormality has occurred in one of the first power supply path 30A and the second power supply path 30B, the control unit 28 turns off the separation relay 32 and does not allow electric current to pass through the connection conduction path 31.

With this configuration, when an abnormality does not occur in the first power supply path 30A and the second power supply path 30B, the separation relay 32 is turned on and electric current is allowed to pass through the connection conduction path 31, and therefore it is possible to drive the first motor 25A and the second motor 25B with use of power from both the first high-voltage battery 21A and the second high-voltage battery 21B. Also, when an abnormality occurs in at least one of the first power supply path 30A and the second power supply path 30B, the separation relay 32 is turned off and electric current is not allowed to pass through the connection conduction path 31, and therefore the abnormality of the one of the power supply path 30A (30B) does not effect the other operating power supply path 30B (30A), and because power is supplied to the motor 25B (25A) through the operating power supply path 30B (30A), it is thus possible to continue to drive the vehicle 10.

Other Embodiments

The technique described in the specification of the present application is not limited to the embodiment described above with reference to the drawings. For example, embodiments such as those described below are also included in the technical scope of the technique described in the specification of the present application.

Two high-voltage batteries 21A and 21B are provided in the present configuration, but there is no limitation thereto. For example, three or more high-voltage batteries may also be provided, and power may also be supplied from three or more high-voltage batteries to the motors 25A and 25B. Also, there need not be a plurality of high-voltage batteries, and configurations are also possible in which one high-voltage battery is connected to and supplies power to both the first power supply path and the second power supply path, and power is supplied to both the first motor 25A and the second motor 25B by the one high-voltage battery.

The embodiments above describe a configuration in which detecting abnormalities in the power supply paths 30A and 30B is performed by detecting abnormalities by the voltage, current, or the like (such as the fluctuating range thereof) exceeding a predetermined threshold value (reference value) at least one location of a plurality of detection locations in the power supply paths 30A and 30B, but there is no limitation to this and, for example, a configuration is also possible in which an abnormality is detected when the voltage, current, or the like (such as the fluctuating range thereof) exceeds a predetermined threshold value (reference value) at a plurality of locations of the plurality of detection locations on the first power supply path 30A (the second power supply path 30B).

The detection unit 27 and control unit 28 are provided in the system control ECU 26, but there is no limitation to this. For example, the detection unit 27 and the control unit 28 may also be provided in a different ECU.

In the embodiment described above, the vehicle 10 is an electric vehicle, but there is no limitation to this. For example, the vehicle 10 may also be a hybrid automobile.

The battery element is a lithium-ion battery, but there is no limitation thereto, and the battery element may also be a different battery. Also, the battery element is not limited to a battery, and may also be a capacitor.

The invention claimed is:

1. A power source system for installation in a vehicle, the power source system comprising:
    a battery element, the battery element including a first battery element and a second battery element;
    a first motor that is configured to receive power supplied from the first battery element and drive a front wheel of the vehicle;
    a first relay that is arranged on a first power supply path between the first battery element and the first motor and is configured to turn the passage of electric current on the first power supply path on and off;
    a second motor that is configured to receive power supplied from the second battery element and drive a rear wheel of the vehicle;
    a second relay that is arranged on a second power supply path between the second battery element and the first motor and is configured to turn the passage of electric current on the second power supply path on and off;
    a detection unit that is configured to detect an abnormality in the first power supply path and the second power supply path;
    a control unit that is configured to control the turning on and off of the first relay and the second relay;
    a connection conduction path that connects the first power supply path and the second power supply path to each other; and
    a separation relay that is arranged on the connection conduction path and is configured to turn the passage of electric current on the connection conduction path on and off,
    wherein, when the detection unit does not detect an abnormality in the first power supply path and the second power supply path, the control unit turns on the first relay and the second relay to allow electric current to pass through the first power supply path and the second power supply path and the control unit turns on the separation relay to allow electric current to pass through the connection conduction path,
    when the detection unit detects an abnormality in the first power supply path, the control unit turns off the first relay to not allow electric current to pass through the first power supply path,
    when the detection unit detects an abnormality in the second power supply path, the control unit turns off the second relay to not allow electric current to pass through the second power supply path, and
    when the detection unit detects that an abnormality has occurred in at least one of the first power supply path and the second power supply path, the control unit turns off the separation relay and does not allow electric current to pass through the connection conduction path.

2. An electric vehicle comprising the power source system according to claim 1, wherein the electric vehicle is capable of traveling by the front wheels and the rear wheels being driven by the first motor and the second motor.

* * * * *